US012606494B2

(12) United States Patent
Ibata et al.

(10) Patent No.:     US 12,606,494 B2
(45) Date of Patent:         Apr. 21, 2026

(54) COMPOSITE MATERIAL SINTERED BODY, JOINED ASSEMBLY, SEMICONDUCTOR MANUFACTURING APPARATUS MEMBER, AND COMPOSITE MATERIAL SINTERED BODY MANUFACTURING METHOD

(71) Applicant: NGK INSULATORS, LTD., Nagoya (JP)

(72) Inventors: Kana Ibata, Nagoya (JP); Asumi Nagai, Okazaki (JP); Katsuhiro Inoue, Ama-Gun (JP)

(73) Assignee: NGK INSULATORS, LTD., Nagoya (JP)

( * ) Notice: Subject to any disclaimer, the term of this patent is extended or adjusted under 35 U.S.C. 154(b) by 276 days.

(21) Appl. No.: 18/438,645

(22) Filed: Feb. 12, 2024

(65)         Prior Publication Data

US 2024/0327301 A1     Oct. 3, 2024

(30)     Foreign Application Priority Data

Mar. 31, 2023     (JP) ................................. 2023-057826

(51) Int. Cl.
| | |
|---|---|
| *C04B 37/00* | (2006.01) |
| *B32B 18/00* | (2006.01) |
| *C04B 35/56* | (2006.01) |
| *C04B 35/58* | (2006.01) |
| *C04B 37/02* | (2006.01) |

(Continued)

(52) U.S. Cl.
CPC ............ *C04B 37/001* (2013.01); *B32B 18/00* (2013.01); *C04B 35/5626* (2013.01); *C04B 35/58092* (2013.01); *C04B 37/021* (2013.01); *C09K 5/14* (2013.01); *C22C 32/0047* (2013.01); *H01L 21/6833* (2013.01); *C04B*

*2235/3826* (2013.01); *C04B 2235/3847* (2013.01); *C04B 2235/3891* (2013.01); *C04B 2235/404* (2013.01); *C04B 2235/85* (2013.01); *C04B 2235/9607* (2013.01);

(Continued)

(58) Field of Classification Search
CPC . C04B 35/5626; C04B 35/565; C04B 35/575; C04B 35/5755; C04B 35/64; C04B 35/645; C04B 35/6455; C04B 37/00; C04B 37/001
See application file for complete search history.

(56)         References Cited

U.S. PATENT DOCUMENTS

| | | | |
|---|---|---|---|
| 2014/0272378 A1 | 9/2014 | Jindo et al. | |
| 2014/0287245 A1 | 9/2014 | Jindo et al. | |
| 2025/0003080 A1* | 1/2025 | Schuck | ............... C23C 16/4485 |

FOREIGN PATENT DOCUMENTS

| | | |
|---|---|---|
| JP | 2014-198662 A | 10/2014 |
| JP | 2014-208567 A | 11/2014 |

OTHER PUBLICATIONS

Sugiyama et al., "*Preparation of WC-SiC Whisker Composites by Hot Pressing and Their Mechanical Properties*," The Japanese Institute of Metals, Materials Transactions, vol. 49, No. 7, (2008) pp. 1644-1649.

(Continued)

*Primary Examiner* — Zachary M Davis
(74) *Attorney, Agent, or Firm* — BURR PATENT LAW, PLLC

(57)         ABSTRACT

A composite material sintered body includes silicon carbide, tungsten silicide, and tungsten carbide, contains 14.4 wt % or more and 48.6 wt % or less of silicon carbide, and has an open porosity of 1% or less.

21 Claims, 3 Drawing Sheets

WC    WSi₂    W₅Si₃    SiC

10μm

(51) Int. Cl.
  *C09K 5/14*           (2006.01)
  *C22C 32/00*          (2006.01)
  *H01L 21/683*         (2006.01)

(52) U.S. Cl.
  CPC .. *C04B 2237/365* (2013.01); *C04B 2237/366*
              (2013.01); *C04B 2237/403* (2013.01)

(56)                    References Cited

OTHER PUBLICATIONS

Korean Office Action (with English translation) dated Aug. 11, 2025
(Application No. 10-2024-0020329).

* cited by examiner

F I G. 2
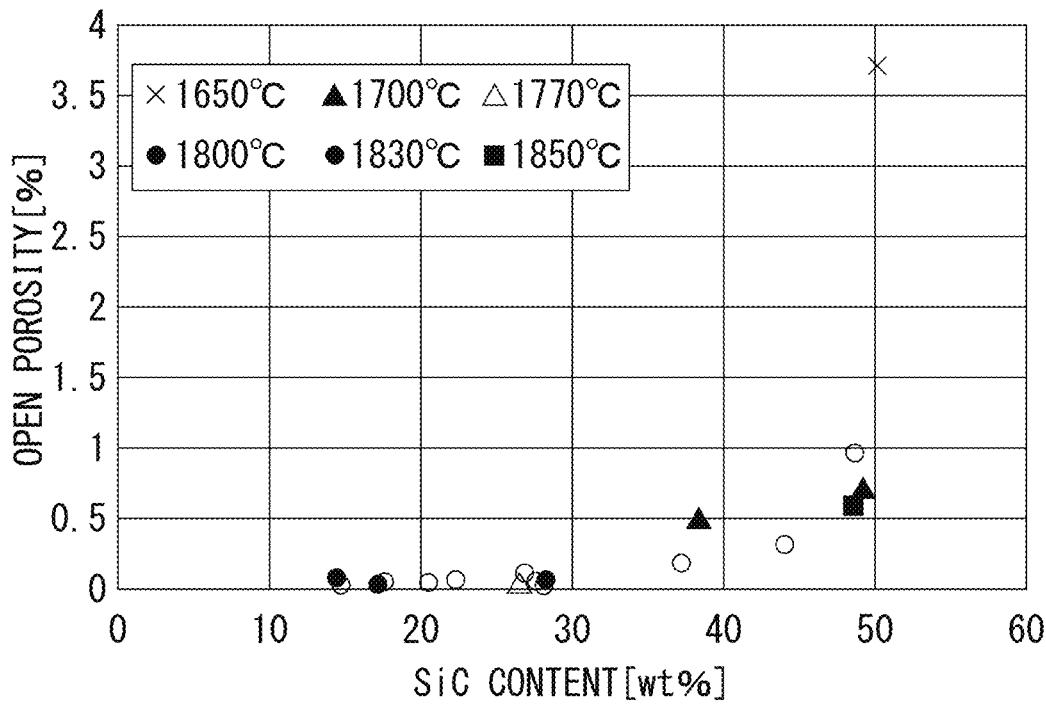

F I G.  3
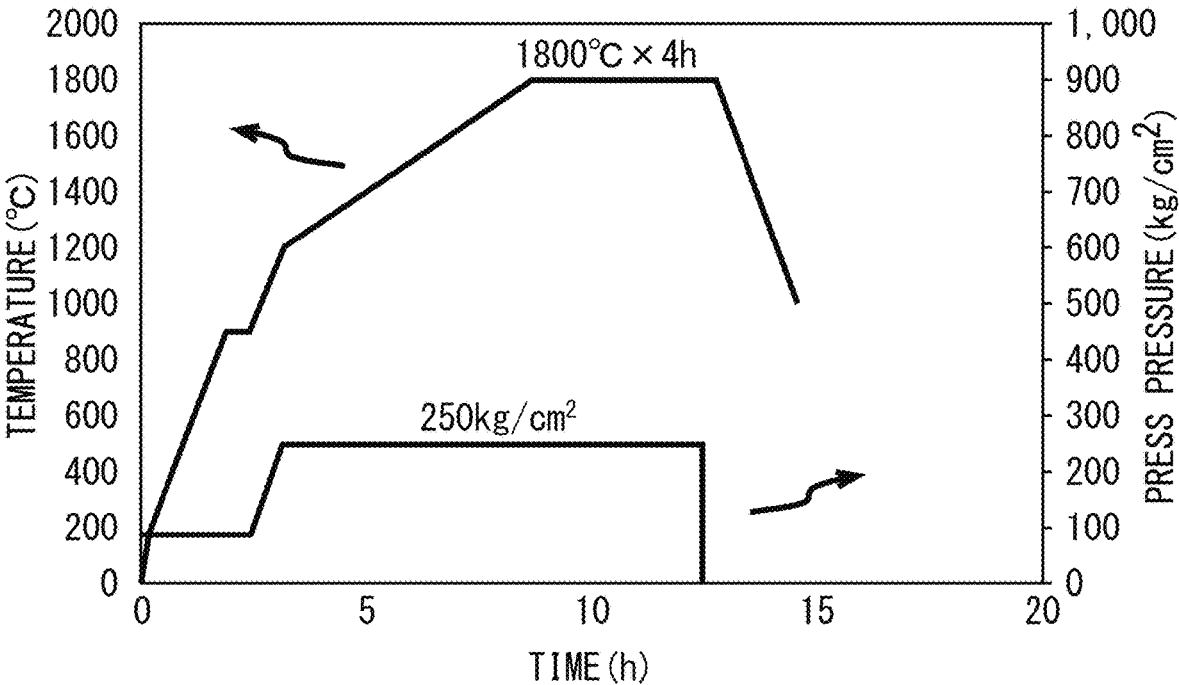

COMPOSITE MATERIAL SINTERED BODY, JOINED ASSEMBLY, SEMICONDUCTOR MANUFACTURING APPARATUS MEMBER, AND COMPOSITE MATERIAL SINTERED BODY MANUFACTURING METHOD

BACKGROUND OF THE INVENTION

Field of the Invention

The present invention relates to composite material sintered bodies.

Description of the Background Art

An electrostatic chuck getting hot in a semiconductor process is joined to a cooling plate for heat dissipation. For example, a dense sintered body of a composite material including silicon carbide, titanium silicide, titanium silicon carbide, and titanium carbide suitable as a constituent material for the cooling plate in a case where the electrostatic chuck is formed of alumina is already known (see Japanese Patent Application Laid-Open No. 2014-198662, for example). The composite material sintered body has a small difference in coefficient of linear thermal expansion from alumina and is dense and of a high strength.

A dense sintered body of a composite material including silicon carbide, titanium silicon carbide, and titanium carbide suitable as a constituent material for the cooling plate in a case where the electrostatic chuck is formed of aluminum nitride is also already known (see Japanese Patent Application Laid-Open No. 2014-208567, for example). The composite material sintered body has a small difference in coefficient of linear thermal expansion from aluminum nitride and is dense and of a high strength.

While aluminum nitride has a coefficient of linear thermal expansion at 40° C. to 570° C. of 5.1 ppm/K, a preferred range of a coefficient of linear thermal expansion at 40° C. to 570° C. of the composite material disclosed in Japanese Patent Application Laid-Open No. 2014-208567 is 5.4 ppm/K to 6.0 ppm/K. It is necessary to increase the amount of silicon carbide to achieve a coefficient of linear thermal expansion of 5.1 ppm/K of a Ti—Si—C-based composite material sintered body as disclosed in Japanese Patent Application Laid-Open No. 2014-208567, but, in this case, there is a problem in that the denseness of the composite material sintered body is reduced to make the composite material sintered body unsuitable for the cooling plate for the electrostatic chuck.

SUMMARY

The present invention relates to a composite material sintered body.

According to the present invention, the composite material sintered body includes silicon carbide, tungsten silicide, and tungsten carbide, contains 14.4 wt % or more and 48.6 wt % or less of silicon carbide, and has an open porosity of 1% or less.

According to the present invention, a dense composite material sintered body less likely to be separated even when joined to aluminum nitride and used under a heating-cooling cycle can be obtained.

According to another aspect of the present invention, a joined assembly has a first member and a second member, wherein the first member includes a composite material sintered body, the second member includes aluminum nitride, and the composite material sintered body includes silicon carbide, tungsten silicide, and tungsten carbide, contains 14.4 wt % or more and 48.6 wt % or less of silicon carbide, and has an open porosity of 1% or less.

According to the present invention, the members are less likely to be separated even when the joined assembly is used under the heating-cooling cycle, so that useful life of a semiconductor manufacturing apparatus member including the joined assembly can be improved.

It is thus an object of the present invention to provide a composite material sintered body that is of different constituent phases than before, has an equal or a smaller difference in coefficient of linear thermal expansion from aluminum nitride to or than before, and is dense.

These and other objects, features, aspects and advantages of the present invention will become more apparent from the following detailed description of the present invention when taken in conjoint with the accompanying drawings.

BRIEF DESCRIPTION OF THE DRAWINGS

FIG. 2 is a graph showing a relationship between a silicon carbide content and an open porosity of the composite material sintered body; and FIG. 3 is an example of a profile of a temperature and a pressure during hot press firing.

DESCRIPTION OF THE PREFERRED EMBODIMENTS

<Composite Material Sintered Body>

Figure 1:
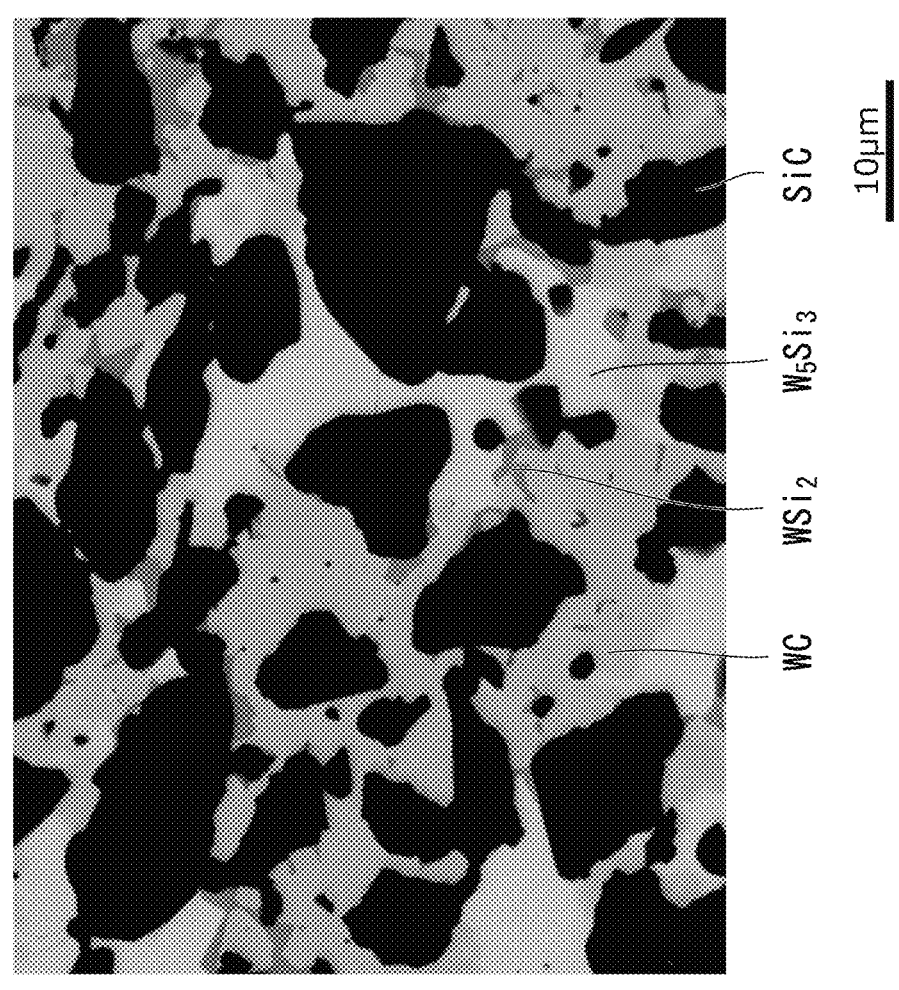
FIG. 1 is one example of a cross-sectional SEM image of a composite material sintered body.

A composite material sintered body according to the present embodiment is a composite material sintered body containing silicon carbide (SiC), tungsten silicide, and tungsten carbide (WC) as crystal phases. The composite material sintered body according to the present embodiment contains 14.4 wt % or more and 48.6 wt % or less silicon carbide (SiC) when a total weight percentage of the crystal phases is 100 wt %. A tungsten silicide content is preferably greater than a silicon carbide content. Tungsten silicide is specifically $WSi_2$ and $W_5Si_3$.

It is confirmed by X-ray diffraction measurement of powder obtained by grinding the sintered body that the composite material sintered body according to the present embodiment contains SiC, tungsten silicide, and tungsten carbide as the crystal phases. Assume that the content of each substance has a value (simply quantified value) obtained based on a diffraction peak of an X-ray diffraction measurement profile.

The composite material sintered body according to the present embodiment is dense to have an open porosity of 1% or less (a dense composite material sintered body). Assume that the open porosity has a value measured by the Archimedes method using pure water as a medium.

More specifically, in the composite material sintered body according to the present embodiment, surfaces of individual crystal particles of silicon carbide are covered with at least one of tungsten silicide and tungsten carbide. Crystal particles of at least one of tungsten silicide and tungsten carbide is thus present in a gap between crystal particles of silicon carbide.

FIG. 1 is one example of a cross-sectional SEM image of the composite material sintered body according to the present embodiment. In FIG. 1, images of four crystal phases, that is, SiC, $WSi_2$, WC, and $WsSi_3$ are viewed in ascending order of brightness (in descending order of darkness). More specifically, it is confirmed that individual crystal particles of SiC, which are substantially black, are spaced apart from one another, and peripheries of the respective crystal particles are covered with crystal particles of $WSi_2$, WC, and $WsSi_3$ without any gaps.

While many pores are formed between particles of silicon carbide in a sintered body having a high silicon carbide content and containing particles of silicon carbide distributed at a high frequency, almost no such pores are formed in the composite material sintered body according to the present embodiment as surfaces of silicon carbide particles are covered with other crystal phase particles. The composite material sintered body according to the present embodiment is thus dense and of a high strength.

The composite material sintered body according to the present embodiment preferably has an open porosity of 0.1% or less. A composite material sintered body satisfying such an open porosity has an extremely high denseness and an extremely high strength.

FIG. 2 is a graph showing a relationship between a silicon carbide content and an open porosity of each of various composite material sintered bodies manufactured under different manufacturing conditions. Specifically, they differ in condition of a maximum temperature and a press pressure during hot press, which will be described below, and data is plotted responsive to the maximum temperature during hot press in FIG. 2. A tendency for the open porosity to increase with increasing silicon carbide content of the composite material sintered body is confirmed in FIG. 2. In particular, in a range of the silicon carbide content of approximately 50 wt % or less, it is seen that a composite material sintered body having an open porosity of 1% or less can be manufactured by suitably setting a manufacturing condition. Furthermore, in a range of the silicon carbide content of approximately 30 wt % or less, it is also seen that a composite material sintered body having an open porosity of 0.1% or less can be manufactured. On the other hand, a silicon carbide content of more than 50 wt % is not preferable since it is difficult to obtain a composite material sintered body having a small open porosity.

The composite material sintered body according to the present embodiment has a similar coefficient of linear thermal expansion to aluminum nitride (AlN). The coefficient of linear thermal expansion is hereinafter also simply referred to as a coefficient of thermal expansion.

Specifically, a difference between the coefficient of thermal expansion at 40° C. to 550° C. of the composite material sintered body according to the present embodiment and an average coefficient of thermal expansion (5.1 ppm/K) at 40° C. to 550° C. of aluminum nitride is 0.5 ppm/K or less. Specifically, the coefficient of thermal expansion at 40° C. to 550° C. of the composite material sintered body according to the present embodiment is 4.6 ppm/K to 5.6 ppm/K and is preferably 4.8 ppm/K to 5.3 ppm/K.

The composite material sintered body according to the present embodiment also has a high thermal conductivity. The thermal conductivity is 90 W/m·K or more and is preferably 100 W/m·K or more.

The composite material sintered body according to the present embodiment also has a high strength. Specifically, a four-point bend strength is 200 MPa or more, is preferably 350 MPa or more, and is more preferably 420 MPa or more.

A fracture toughness value (K1c) of the composite material sintered body according to the present embodiment is 6.0 $MPa \cdot m^{1/2}$ to 8.8 $MPa \cdot m^{1/2}$ and is preferably 6.2 $MPa \cdot m^{1/2}$ to 8.8 $MPa \cdot m^{1/2}$.

A Young's modulus of the composite material sintered body according to the present embodiment is only required to be 273 GPa to 594 GPa, is preferably 330 GPa to 594 GPa, and is more preferably 460 GPa to 594 GPa.

<Joined Assembly>

As described above, the composite material sintered body according to the present embodiment has a similar coefficient of thermal expansion to aluminum nitride. Thus, even when a joined assembly in which a member (first member) including the composite material sintered body according to the present embodiment and a member (second member) manufactured from aluminum nitride are joined (e.g., metallurgically joined) together is used under a heating-cooling cycle in which a low temperature and a high temperature are alternated, these members are less likely to be separated.

The joined assembly is applicable to a semiconductor manufacturing apparatus member, for example. A semiconductor manufacturing apparatus member obtained by joining a cooling plate (the first member) manufactured from the composite material sintered body according to the present embodiment and an electrostatic chuck (the second member) manufactured from aluminum nitride using a joining material containing aluminum or an alloy thereof as a main component and the like are taken as examples.

In the joined assembly or the semiconductor manufacturing apparatus member, a difference in coefficient of linear thermal expansion between the first member and the second member is extremely small, so that the first member is less likely to be separated from the second member even when used under the heating-cooling cycle.

In addition, the first member composed of the composite material sintered body according to the present embodiment has a sufficiently high thermal conductivity, thus can efficiently relieve heat of the second member composed of aluminum nitride, and can effectively cool the second member.

Furthermore, the first member composed of the composite material sintered body according to the present embodiment has a sufficiently high density and can have a structure that allows a cooling liquid to pass therethrough. In this case, the efficiency of cooling the second member is further improved.

In addition, the first member composed of the composite material sintered body according to the present embodiment has a sufficiently high strength and thus can sufficiently withstand stress caused during processing and joining to manufacture the semiconductor manufacturing apparatus member and stress caused due to a temperature difference during use as the member as completed.

That is to say, useful life of the semiconductor manufacturing apparatus member can be improved by using the composite material sintered body according to the present embodiment as the cooling plate for the electrostatic chuck.

<Composite Material Sintered Body Manufacturing Method>

A method of manufacturing the composite material sintered body according to the present embodiment will be described next. In the present embodiment, a desired composite material sintered body is generally obtained by procedures of mixing raw material powder weighed at predetermined weight percentages, forming mixed powder as obtained into a predetermined shape, and then subjecting a formed body as obtained to hot press firing.

As the raw material powder, 5.7 wt % to 27.7 wt % of SiC, 12.5 wt % to 55.3 wt % of $WSi_2$, and 17.0 wt % to 55.7 wt % of tungsten (W) or 49.5 wt % to 81.3 wt % of WC are prepared so that a total weight percentage is 100 wt %. SiC preferably has a weight percentage of 6.0 wt % or more and 13.1 wt % or less.

A particle diameter of SiC raw material powder is not particularly limited, but an average particle diameter is preferably 2 μm to 35 μm. Only coarse particles (e.g., particles having an average particle diameter of 15 μm to 35 μm) may be used, only fine particles (e.g., particles having an average particle diameter of 2 μm to 10 μm) may be used, and the coarse particles and the fine particles may be mixed and used.

In a case where SiC powder having an average particle diameter of less than 2 μm is used, a large SiC ratio in the mixed powder increases a surface area of SiC particles and thus reduces a degree of sintering, making a dense sintered body less likely to be obtained. On the other hand, in a case where SiC powder having an average particle diameter of more than 35 μm is used, a sufficiently high strength might not be obtained even if there is no problem with the degree of sintering.

Dry mixing using a fast fluidized mixer is taken as an example of mixing of the raw material powder. For example, in a case where the raw material powder has a total weight of approximately 300 g to 500 g, it is preferable to set a rotational speed of an agitation blade of the fast fluidized mixer to approximately 1000 rpm to 1500 rpm and agitate the raw material powder for 10 to 15 minutes.

Alternatively, wet mixing using a nylon pot and nylon balls with iron cores may be performed using isopropyl alcohol as a solvent. In this case, a slurry obtained by mixing is dried at 110° C. for 16 hours in a nitrogen stream, for example, and is then sieved to obtain the mixed powder.

A formed body obtained by forming the mixed powder is subjected to hot press firing under an inert atmosphere. The inert atmosphere is exemplified by a vacuum atmosphere, a nitrogen gas atmosphere, an argon gas atmosphere, and the like.

A pressure (press pressure) during hot press is preferably 225 kgf/cm$^2$ to 300 kgf/cm$^2$ and is more preferably 250 kgf/cm$^2$ to 300 kgf/cm$^2$. A pressure of less than 200 kgf/cm$^2$ is not preferable as a sintered body is not densified, and an open porosity exceeds 1%.

A maximum temperature during hot press is preferably 1700° C. to 1850° C. and is more preferably 1770° C. to 1830° C. A maximum temperature of 1900° C. or more is not preferable as a material is melted, and a sintered body having a desired shape cannot be obtained. On the other hand, a maximum temperature of less than 1700° C. is not preferable as sintering does not sufficiently progress.

A specific profile of a pressure and a temperature during hot press (hereinafter a hot press condition) is only required to be set as appropriate within the above-mentioned preferred ranges responsive to a composition of a powder mixture (weight percentages of the raw material powder), a particle diameter of the raw material powder, a size and a shape of the formed body, and the like. As a weight percentage of silicon carbide in the mixed powder decreases, sintering tends to progress, and thus an allowable range of the hot press condition to achieve densification tends to be relatively wide. The allowable range of the hot press condition to achieve densification tends to be relatively wide in a case where the coarse particles and the fine particles are mixed and used compared with a case where only the coarse particles are used for silicon carbide.

Firing time is also only required to be set as appropriate responsive to the hot press condition, the size and the shape of the formed body, and the like. For example, in a case where a disc-shaped formed body having a diameter of approximately 50 mm and a thickness of approximately 15 mm is subjected to hot press firing, the formed body is preferably held at the maximum temperature for four to eight hours.

<Joined Assembly Manufacturing Method>

A method (joining method) of obtaining the joined assembly in which the first member including the composite material sintered body according to the present embodiment and the second member manufactured from aluminum nitride are joined together will be described. There are two types of the joining method: metallurgical joining in which these members are joined via a metal joining layer and direct joining in which these members are joined directly.

In a case of metallurgical joining, a stack of the composite material sintered body according to the present embodiment having been processed into a predetermined shape, such as a disc shape, a metal foil of aluminum, and a dense aluminum nitride sintered body stacked in this order is only required to be stored in a firing graphite mold and be subjected to hot press firing under an inert gas atmosphere. The inert atmosphere is exemplified by the vacuum atmosphere, the nitrogen gas atmosphere, the argon gas atmosphere, and the like.

The metal foil is only required to have a thickness of approximately 180 μm to 220 μm. Stack surfaces of the composite material sintered body, the metal foil, and aluminum nitride preferably have the same shape.

A maximum temperature, a press pressure, and holding time at the maximum temperature during hot press firing are only required to be set to 1770° C. to 1830° C., a value in a range of 250 kgf/cm$^2$ to 300 kgf/cm$^2$, and four to eight hours, respectively. A joined assembly (metallurgical joined assembly) having no separation and no void at an interface is thereby obtained.

In a case of direct joining, a powder mixture having a composition ratio allowing for obtainment of the composite material sintered body according to the present embodiment is first subjected to uniaxial pressing under a predetermined press condition to obtain a formed body, for example, having a disc shape. A stack of the formed body and a dense aluminum nitride sintered body is then stored in a firing graphite mold and is subjected to hot press firing under an inert gas atmosphere. The inert atmosphere is exemplified by the vacuum atmosphere, the nitrogen gas atmosphere, the argon gas atmosphere, and the like.

In this case, stack surfaces of the formed body and aluminum nitride preferably have the same shape.

A maximum temperature, a press pressure, holding time at the maximum temperature during hot press firing are only required to be set to 1770° C. to 1830° C., a value in a range of 250 kgf/cm$^2$ to 300 kgf/cm$^2$, and four to eight hours, respectively. A joined assembly (direct joined assembly) having no separation and no void at an interface is thereby obtained.

EXAMPLES

Attempts were made to manufacture and evaluate composite material sintered bodies in 26 experimental examples (Examples 1 to 26) differing in combination of a composition of the raw material powder and the hot press condition. A powder mixture, a formed body, and a fired body of the same experimental example are hereinafter also referred to as samples without distinguishing states thereof.

<Raw Material Powder>

SiC, $WSi_2$, W, and WC were prepared as the raw material powder.

As SiC raw material powder, three types of commercially available products differing in particle size were prepared. Specifically, three types of powder including powder having an average particle diameter of 36 μm (hereinafter referred to as a product #500), powder having an average particle diameter of 15 μm (hereinafter referred to as a product #1000), and powder having an average particle diameter of 3 μm (hereinafter referred to as a product #6000) were prepared. They each had a purity of 99% or more.

As $WSi_2$ raw material powder, a commercially available product having a purity of 99% or more and an average particle diameter of 6 μm was used. As WC raw material powder, a commercially available product having a purity of 99% or more and an average particle diameter of 2 μm was used. As W raw material powder, a commercially available product having a purity of 99% or more and an average particle diameter of 2.3 μm was used.

<Manufacture of Sintered Body>

Raw material compositions and hot press conditions of all the experimental examples are shown in Table 1 as a list. Table 1 also shows whether a sample was melted during hot press firing.

The obtained powder mixture in each of the experimental examples was subjected to uniaxial pressing at a pressure of 200 $kgf/cm^2$ to manufacture a disc-shaped formed body having a diameter of approximately 50 mm and a thickness of approximately 15 mm. The manufactured formed body was stored in the firing graphite mold.

The formed body was subjected to hot press firing to obtain the composite material sintered body. The maximum temperature during hot press firing was at seven different levels of 1650° C., 1700° C., 1770° C., 1800° C., 1830° C., 1850° C., and 1900° C. The holding time at the maximum temperature was four hours. The pressure was at four different levels of 200 $kgf/cm^2$, 225 $kgf/cm^2$, 250 $kgf/cm^2$, and 300 $kgf/cm^2$. Application of the pressure was started when a firing temperature reached 900° C. FIG. 3 is an example of a profile of the temperature and the pressure in the case that the maximum temperature and the pressure during hot press firing were 1800° C. and 250 $kgf/cm^2$, respectively.

<Composition and Various Characteristics of Composite Material Sintered Body>

For the composite material sintered body in each of the experimental examples as obtained, constituent phases were

TABLE 1

| | RAW MATERIAL COMPOSITION (wt %) | | | | | | | | HOT PRESS CONDITION | | MELTING |
| | | | | | | | | | MAXIMUM | PRESS | OF SAMPLE |
| EXAMPLE | SiC #500 | SiC #1000 | SiC #6000 | $WSi_2$ | W | WC | SiC TOTAL | TOTAL | TEMPERATURE °C. | PRESSURE $kgf/cm^2$ | 1 = MELTED 0 = NOT MELTED |
|---|---|---|---|---|---|---|---|---|---|---|---|
| 1 | 18.0 | | 9.7 | 55.3 | 17.0 | | 27.7 | 100 | 1800 | 250 | 0 |
| 2 | 18.0 | | 9.7 | 55.3 | 17.0 | | 27.7 | 100 | 1700 | 250 | 0 |
| 3 | 15.8 | | 8.5 | 20.0 | 55.7 | | 24.3 | 100 | 1800 | 250 | 0 |
| 4 | 15.8 | | 8.5 | 20.0 | 55.7 | | 24.3 | 100 | 1700 | 250 | 0 |
| 5 | 15.8 | | 8.5 | 20.0 | 55.7 | | 24.3 | 100 | 1800 | 250 | 0 |
| 6 | | 13.1 | | 22.2 | | 64.7 | 13.1 | 100 | 1800 | 250 | 0 |
| 7 | | 13.1 | | 22.2 | | 64.7 | 13.1 | 100 | 1770 | 250 | 0 |
| 8 | | 13.1 | | 22.2 | | 64.7 | 13.1 | 100 | 1830 | 250 | 0 |
| 9 | | 13.1 | | 22.2 | | 64.7 | 13.1 | 100 | 1800 | 200 | 0 |
| 10 | | 11.4 | | 39.1 | | 49.5 | 11.4 | 100 | 1800 | 250 | 0 |
| 11 | | 9.1 | | 31.5 | | 59.4 | 9.1 | 100 | 1800 | 250 | 0 |
| 12 | | 9.1 | | 31.5 | | 59.4 | 9.1 | 100 | 1800 | 250 | 0 |
| 13 | | 9.1 | | 31.5 | | 59.4 | 9.1 | 100 | 1800 | 200 | 0 |
| 14 | | | 8.5 | 19.6 | | 71.9 | 8.5 | 100 | 1800 | 250 | 0 |
| 15 | 5.0 | | 1.2 | 12.5 | | 81.3 | 6.2 | 100 | 1800 | 250 | 0 |
| 16 | 5.0 | | 1.2 | 12.5 | | 81.3 | 6.2 | 100 | 1900 | 250 | 1 |
| 17 | 5.0 | | 1.2 | 12.5 | | 81.3 | 6.2 | 100 | 1830 | 250 | 0 |
| 18 | | 6.2 | | 12.5 | | 81.3 | 6.2 | 100 | 1800 | 250 | 0 |
| 19 | | 6.2 | | 12.5 | | 81.3 | 6.2 | 100 | 1830 | 250 | 0 |
| 20 | | 6.2 | | 12.5 | | 81.3 | 6.2 | 100 | 1900 | 250 | 1 |
| 21 | | 6.2 | | 12.5 | | 81.3 | 6.2 | 100 | 1830 | 250 | 0 |
| 22 | | 12.8 | | 13.5 | | 73.7 | 12.8 | 100 | 1800 | 250 | 0 |
| 23 | | 5.7 | | 26.7 | | 67.6 | 5.7 | 100 | 1800 | 250 | 0 |
| 24 | 18.0 | | 9.7 | 55.3 | 17.0 | | 27.7 | 100 | 1850 | 225 | 0 |
| 25 | 18.0 | | 9.7 | 55.3 | 17.0 | | 27.7 | 100 | 1700 | 300 | 0 |
| 26 | 18.0 | | 9.7 | 55.3 | 17.0 | | 27.7 | 100 | 1650 | 300 | 0 |

In each of the experimental examples, a total of 300 g of SiC raw material powder, $WSi_2$ raw material powder, and WC raw material powder or W raw material powder was first weighed to have a composition ratio (weight percentage) shown in Table 1 in manufacturing the composite material sintered body. The weighed three types of powder were loaded into a fast fluidized mixer including a powder loading unit having a capacity of 1.8 L and agitated and mixed at 1500 rpm for 10 minutes to obtain a powder mixture.

identified, and composition ratios (content) thereof were calculated (simply quantified). An open porosity, a bulk density, a bend strength, and a coefficient of thermal expansion were measured to evaluate characteristics.

Results of measurement of the composition ratios of the constituent phases, the open porosity, the bulk density, the bend strength, the coefficient of thermal expansion, a fracture toughness value, a Young's modulus, and a thermal conductivity for the sintered body in each of the examples are shown in Table 2 as a list.

TABLE 2

| | SINTERED BODY COMPOSITION (wt %) | | | | | | | SINTERED BODY CHARACTERISTICS | | | |
| | | | | | | | | OPEN | BULK | BEND | COEFFICIENT OF THERMAL |
| EXAMPLE | SiC | WSi$_2$ | W$_5$Si$_3$ | WC | WSi$_2$ + W$_5$Si$_3$ | SiC + WC | TOTAL | POROSITY % | DENSITY g/cm$^3$ | STRENGTH MPa | EXPANSION ppm/K |
|---|---|---|---|---|---|---|---|---|---|---|---|
| 1 | 48.6 | 30.7 | 18.8 | 1.9 | 49.5 | 50.5 | 100 | 0.97 | 6.31 | 246.1 | 5.5 |
| 2 | 46.8 | 41.1 | 4.1 | 8.0 | 45.2 | 54.8 | 100 | 2.96 | 6.21 | 251.3 | 5.9 |
| 3 | 44 | 4.4 | 42.6 | 9.0 | 47.0 | 53.0 | 100 | 0.30 | 7.98 | 264.2 | 5.1 |
| 4 | 38.4 | 27.1 | 7.5 | 27.0 | 34.6 | 65.4 | 100 | 0.32 | 8.00 | 266.6 | 5.6 |
| 5 | 37.2 | 20.6 | 8.2 | 34.0 | 28.8 | 71.2 | 100 | 0.18 | 8.01 | 339.8 | 5.1 |
| 6 | 27.7 | 5.6 | 23.9 | 42.8 | 29.5 | 70.5 | 100 | 0.05 | 9.42 | 495.0 | 5.1 |
| 7 | 30.3 | 7.6 | 18.7 | 43.4 | 26.3 | 73.7 | 100 | 0.04 | 9.44 | 490.0 | 5.0 |
| 8 | 28.2 | 5.2 | 26.3 | 40.3 | 31.5 | 68.5 | 100 | 0.05 | 9.42 | 485.0 | 4.9 |
| 9 | 28.6 | 8.4 | 19.6 | 43.4 | 28.0 | 72.0 | 100 | 5.61 | 8.72 | 176.0 | 5.0 |
| 10 | 26.8 | 7.0 | 47.3 | 18.9 | 54.3 | 45.7 | 100 | 0.10 | 9.06 | 357.3 | 5.2 |
| 11 | 22.3 | 9.6 | 32 | 36.1 | 41.6 | 58.4 | 100 | 0.06 | 9.98 | 457.7 | 5.3 |
| 12 | 20.5 | 8.9 | 36.3 | 34.3 | 45.2 | 54.8 | 100 | 0.04 | 9.89 | 432.1 | 5.3 |
| 13 | 25.4 | 6.7 | 24.5 | 43.4 | 31.2 | 68.8 | 100 | 4.73 | 7.56 | 156.0 | 5.0 |
| 14 | 17.5 | 9.0 | 20.1 | 53.4 | 29.1 | 70.9 | 100 | 0.04 | 10.68 | 444.8 | 5.3 |
| 15 | 17.2 | 3.3 | 19.4 | 60.1 | 22.7 | 77.3 | 100 | 0.02 | 11.72 | 351.8 | 4.9 |
| 16 | (SINTERED BODY NOT OBTAINED DUE TO MELTING OF SAMPLE) | | | | | | | | | | |
| 17 | 17.2 | 3.3 | 19.4 | 60.1 | 22.7 | 77.3 | 100 | 0.02 | 11.72 | 351.8 | 4.9 |
| 18 | 15.6 | 5.4 | 13.7 | 65.3 | 19.1 | 80.9 | 100 | 0.06 | 11.79 | 564.4 | 4.8 |
| 19 | 14.4 | 3.6 | 13.7 | 68.3 | 17.3 | 82.7 | 100 | 0.06 | 11.79 | 565.0 | 4.8 |
| 20 | (SINTERED BODY NOT OBTAINED DUE TO MELTING OF SAMPLE) | | | | | | | | | | |
| 21 | 14.4 | 3.6 | 13.7 | 68.3 | 17.3 | 82.7 | 100 | 0.02 | 11.54 | 421.9 | 4.9 |
| 22 | 28.1 | 3.6 | 9.1 | 59.2 | 12.7 | 87.3 | 100 | 0.02 | 11.37 | 423.0 | 4.6 |
| 23 | 14.6 | 22.4 | 20.1 | 42.9 | 42.5 | 57.5 | 100 | 0.02 | 11.37 | 424.0 | 5.6 |
| 24 | 48.6 | 30.7 | 18.8 | 1.9 | 49.5 | 50.5 | 100 | 0.60 | 6.40 | 252.0 | 5.4 |
| 25 | 47.9 | 34.7 | 15.2 | 2.2 | 49.5 | 50.1 | 100 | 0.72 | 6.40 | 247.2 | 5.4 |
| 26 | 50.1 | 41.1 | 5.4 | 3.4 | 49.5 | 53.5 | 100 | 3.70 | 6.40 | 116.0 | 5.4 |

| | SINTERED BODY CHARACTERISTICS | | | |
| EXAMPLE | FRACTURE TOUGHNESS VALUE MPam$^{1/2}$ | YOUNG'S MODULUS GPa | THERMAL CONDUCTIVITY W/mK | WORKING EXAMPLE OR COMPARATIVE EXAMPLE |
|---|---|---|---|---|
| 1 | 6.0 | 454 | 111 | WORKING EXAMPLE |
| 2 | — | — | — | COMPARATIVE EXAMPLE |
| 3 | — | — | — | WORKING EXAMPLE |
| 4 | 6.3 | 448 | 120 | WORKING EXAMPLE |
| 5 | 6.5 | 484 | 131 | WORKING EXAMPLE |
| 6 | 7.1 | 482 | 110 | WORKING EXAMPLE |
| 7 | 7.3 | 520 | 130 | WORKING EXAMPLE |
| 8 | 7.2 | 497 | 112 | WORKING EXAMPLE |
| 9 | — | — | — | COMPARATIVE EXAMPLE |
| 10 | 6.3 | 464 | 104 | WORKING EXAMPLE |
| 11 | 7.9 | 448 | 98 | WORKING EXAMPLE |
| 12 | 7.2 | — | 104 | WORKING EXAMPLE |
| 13 | — | — | — | COMPARATIVE EXAMPLE |
| 14 | 6.7 | 478 | 128 | WORKING EXAMPLE |
| 15 | 8.5 | 533 | 134 | WORKING EXAMPLE |
| 16 | (SINTERED BODY NOT OBTAINED DUE TO MELTING OF SAMPLE) | | | COMPARATIVE EXAMPLE |
| 17 | 8.2 | 533 | 138 | WORKING EXAMPLE |
| 18 | 7.5 | 561 | 148 | WORKING EXAMPLE |
| 19 | 7.5 | 561 | 150 | WORKING EXAMPLE |
| 20 | (SINTERED BODY NOT OBTAINED DUE TO MELTING OF SAMPLE) | | | COMPARATIVE EXAMPLE |
| 21 | 7.8 | 523 | 146 | WORKING EXAMPLE |
| 22 | 6.0 | 332 | 104 | WORKING EXAMPLE |
| 23 | 8.2 | 548 | 134 | WORKING EXAMPLE |
| 24 | 6.2 | 462 | 133 | WORKING EXAMPLE |
| 25 | 6.1 | 445 | 141 | WORKING EXAMPLE |
| 26 | — | — | — | COMPARATIVE EXAMPLE |

As shown in Table 2, Example 1, Examples 3 to 8, Examples 10 to 12, Examples 14 to 15, Examples 17 to 19, and Examples 21 to 25 correspond to working examples, and the other examples correspond to comparative examples.

The fracture toughness value (a K1c value), the Young's modulus, and the thermal conductivity were measured for the composite material sintered body corresponding to each of the working examples except for some of the working examples. Table 2 also shows results of measurement of them.

On the other hand, in each of Example 16 and Example 20 in which the maximum temperature during hot press firing was 1900° C., a sample was melted during firing as shown in Table 1, and a sintered body having a desired shape was not obtained, so that constituent phases were not identified, and none of the above-mentioned various characteristics was measured.

(Identification and Simple Quantification of Constituent Phases)

Except for Example 16 and Example 20, the composite material sintered body obtained by the above-mentioned procedures was ground with a mortar and subjected to X-ray diffraction measurement ($\theta$-2$\theta$ measurement) using an encapsulating tube-type X-ray diffraction apparatus (D8 ADVANCE from Bruker AXS). Constituent phases (crystal phases) of the composite material sintered body were identified based on a peak pattern appearing in an X-ray diffraction profile as obtained. CuK$\alpha$ radiation was used as a characteristic X-ray, tube power was 40 kV and 40 mA, and a measurement range was 2$\theta$=5° to 70°.

Composition ratios (content) of crystal phases contained in the composite material sintered body were obtained by simple quantification based on an intensity of a peak appearing in the X-ray diffraction profile. A simple profile fitting function (FPM Eval.) of powder diffraction data analysis software "EVA" from Bruker AXS was used for simple quantification. The function is to calculate a weight percentage of a constituent phase using I/I$_{cor}$ (a ratio of an intensity to a diffraction intensity of corundum) of an ICDD PDF card of an identified crystal phase.

(Measurement of Open Porosity and Bulk Density)

Measurement was made by the Archimedes method using pure water as a medium.

(Measurement of Four-Point Bend Strength)

Measurement was made according to JIS-R 1601.

(Measurement of Coefficient of Thermal Expansion)

An average coefficient of linear thermal expansion at 40° C. to 550° C. was calculated using TD5020S (a horizontal differential expansion measurement method) from Bruker AXS.

Specifically, a temperature was raised twice to 650° C. under a condition of a ramp up rate of 20° C./min. in an argon atmosphere, and the average coefficient of linear thermal expansion was calculated from second measurement data. An alumina standard sample (a purity of 99.7%, a bulk density of 3.9 g/cm$^3$, and a length of 20 mm) attached to the apparatus was used as a standard sample.

(Measurement of Fracture Toughness Value)

Fracture toughness was evaluated by an SEPB method according to JIS-R 1607.

(Measurement of Young's Modulus)

The Young's modulus was measured according to JIS R 1602 (testing methods for elastic modulus of fine ceramics).

(Measurement of Thermal Conductivity)

Measurement was made by a laser flash method.

DETAILS OF EXPERIMENTAL EXAMPLES

Example 1 to Example 5

In each of Example 1 to Example 5, the composite material sintered body was manufactured using SiC powder, WSi$_2$ powder, and W powder as raw materials. The product #500 and the product #6000 were used as the SiC powder.

As shown in Table 1, a raw material composition was common in Example 1 and Example 2 as follows:
SiC (product #500): 18.0 wt %;
SiC (product #6000): 9.7 wt %;
Wsi$_2$: 55.3 wt %; and
W: 17.0 wt %.

The raw material composition was common in Example 3 to Example 5 as follows:
SiC (product #500): 15.8 wt %;
SiC (product #6000): 8.5 wt %;
Wsi$_2$: 20.0 wt %; and
W: 55.7 wt %.

That is to say, a percentage of W was significantly increased, a percentage of WSi$_2$ was significantly reduced, and a percentage of SiC was slightly reduced in each of Example 3 to Example 5 compared with those in each of Example 1 and Example 2.

As the hot press condition, the maximum temperature was 1700° C. in each of Example 2 and Example 4 and was 1800° C. in each of Example 1, Example 3, and Example 5. A common press pressure of 250 kgf/cm$^2$ was used.

In each of Example 1 to Example 5, a sintered body was obtained, and only SiC, WSi$_2$, W$_5$Si$_3$, and WC were identified as constituent phases. The sintered body had an SiC content of 48.6 wt % or less.

While the sintered body had an open porosity of 1% or less in each of Example 1 and Example 3 to Example 5, the sintered body had an open porosity of significantly more than 1% in Example 2. That is to say, a dense composite material sintered body was obtained in each of Example 1 and Example 3 to Example 5 but was not obtained in Example 2.

More specifically, the open porosity was 1% or less in each of Example 1, Example 3, and Example 5 in which the maximum temperature during hot press firing was 1800° C., whereas, in each of Example 2 and Example 4 in which the maximum temperature during hot press firing was 1700° C., the open porosity was 1% or less only in the latter. Example 2 and Example 4 differ only in raw material composition, so that it can be said that at least the maximum temperature during hot press firing is required to be set responsive to the raw material composition in a case where W is used as a raw material.

The coefficient of thermal expansion had a value in a range of 4.6 ppm/K to 5.6 ppm/K except for Example 2. On the other hand, the bend strength exceeded 200 MPa but fell below 350 MPa in each of the experimental examples. In each of Example 1, Example 4, and Example 5, the fracture toughness value (K1c) was 6.0 MPa·m$^{1/2}$ to 6.5 MPa·m$^{1/2}$, and the Young's modulus was 448 GPa to 484 GPa. The thermal conductivity was 100 W/m·K or more.

Results in Example 1 to Example 5 indicate that, in a case where a weight percentage of SiC has a value in a range of 5.7 wt % to 27.7 wt %, a weight percentage of WSi$_2$ has a value in a range of 12.5 wt % to 55.3 wt %, and a weight percentage of W has a value in a range of 17.0 wt % to 55.7 wt % in the raw material powder, a composite material sintered body that contains 14.4 wt % or more and 48.6 wt % or less of silicon carbide, is dense to have an open porosity of 1% or less, and has a coefficient of thermal expansion close to a coefficient of thermal expansion of aluminum nitride can be obtained by appropriately setting the hot press condition responsive to the raw material composition.

Example 6 to Example 14

In each of Example 6 to Example 14, the composite material sintered body was manufactured using SiC powder, WSi$_2$ powder, and WC powder as raw materials. Only the product #1000 was used as the SiC powder.

As shown in Table 1, the raw material composition was common in Example 6 to Example 9 as follows:

SiC (product #1000): 13.1 wt %;

WSi$_2$: 22.2 wt %; and

WC: 64.7 wt %.

The raw material composition in Example 10 was as follows:

SiC (product #1000): 11.4 wt %;

WSi$_2$: 39.1 wt %; and

WC: 49.5 wt %.

The raw material composition was common in Example 11 to Example 13 as follows:

SiC (product #1000): 9.1 wt %;

WSi$_2$: 31.5 wt %; and

WC: 59.4 wt %.

The raw material composition in Example 14 was as follows:

SiC (product #1000): 8.5 wt %;

WSi$_2$: 19.6 wt %; and

WC: 71.9 wt %.

That is to say, Example 6 to Example 9, Example 10, Example 11 to Example 13, and Example 14 have such a relationship that weight percentages of SiC and WSi$_2$ decrease and a weight percentage of WC increases in raw materials in the stated order.

On the other hand, as the hot press condition, the maximum temperature was 1800° C. except that the maximum temperature was 1770° C. in Example 7 and was 1830° C. in Example 8. The press pressure was 250 kgf/cm$^2$ except that the press pressure was 200 kgf/cm$^2$ in each of Example 9 and Example 13.

That is to say, Example 6 to Example 8 differ only in maximum temperature during hot press firing. Example 6 and Example 9 differ only in pressure during hot press firing. Similarly, Example 11 and Example 12 differ from Example 13 only in pressure during hot press firing.

On the other hand, Example 6, Example 10, Example 11 and Example 12, and Example 14 have the same hot press condition and differ only in raw material composition.

The raw material composition and the hot press condition are common in Example 11 and Example 12.

In each of Example 6 to Example 14, a sintered body was obtained, and only SiC, WSi$_2$, WsSi$_3$, and WC were identified as constituent phases. The sintered body had an SiC content having a value in a range of 14.4 wt % or more and 48.6 wt % or less in each of the examples.

The open porosity significantly exceeded 1% in each of Example 9 and Example 13 in which the press pressure during hot press firing was 200 kgf/cm$^2$. That is to say, the dense composite material sintered body was not obtained. On the other hand, in each of Example 6 to Example 8, Example 10 to Example 12, and Example 14 in which the press pressure was 250 kgf/cm$^2$, the open porosity was 0.1% or less. That is to say, an extremely dense composite material sintered body was obtained.

In each of Example 6 to Example 8, Example 10 to Example 12, and Example 14 in which the dense composite material sintered body was obtained, a tungsten silicide (WSi$_2$ and WsSi$_3$) content was greater than a silicon carbide (SiC) content except for Example 7.

The coefficient of thermal expansion had a value in a range of 4.9 ppm/K to 5.3 ppm/K, which satisfied a range of 4.6 ppm/K to 5.6 ppm/K, in each of experimental examples. That is to say, a difference in coefficient of thermal expansion from aluminum nitride was 0.2 ppm/K or less.

The composite material sintered body in each of Example 6 to Example 8, Example 10 to Example 12, and Example 14 in which the open porosity was 0.1% or less and which was determined to have an extremely high density had a bend strength of more than 350 MPa. Furthermore, the composite material sintered body had a fracture toughness value (K1c) of 6.3 MPa·m$^{1/2}$ to 7.9 MPa·m$^{1/2}$ and had a Young's modulus of 448 GPa to 520 GPa except for Example 12 in which the Young's modulus was not measured. The thermal conductivity was 100 W/m. K or more except that the thermal conductivity was 98 W/m·K in Example 11.

Example 15 to Example 21

In each of Example 15 to Example 21, the composite material sintered body was manufactured using SiC powder, WSi$_2$ powder, and WC powder as raw materials. As the SiC powder, the product #500 and the product #6000 were used in each of Example 15 to Example 17, and only the product #1000 was used in each of Example 18 to Example 21.

As shown in Table 1, the raw material composition was common in Example 15 to Example 17 as follows:

SiC (product #500): 5.0 wt %;

SiC (product #6000): 1.2 wt %;

WSi$_2$: 12.5 wt %; and

WC: 81.3 wt %.

The raw material composition was common in Example 18 to Example 21 as follows:

SiC (product #1000): 6.2 wt %;

WSi$_2$: 12.5 wt %; and

WC: 81.3 wt %.

That is to say, in each of Example 15 to Example 21, the weight percentages of SiC and WSi$_2$ were each smaller and the weight percentage of WC was greater than those in each of Example 6 to Example 14. Example 15 to Example 17 and Example 18 to Example 21 have the same weight percentage of SiC as a whole but differ in particle size of used powder.

On the other hand, as the hot press condition, the maximum temperature was 1800° C. in each of Example 15 and Example 18, was 1900° C. in each of Example 16 and Example 20, and was 1830° C. in each of Example 17, Example 19, and Example 21. A common press pressure of 250 kgf/cm$^2$ was used.

As a result, in each of Example 16 and Example 20 in which the maximum temperature during hot press firing was 1900° C., the sample was melted during firing, and the sintered body was not obtained as described above.

In each of Example 15, Example 17 to Example 19, and Example 21 in which the maximum temperature during hot press firing was 1800° C. or 1830° C., the sintered body was obtained, and only SiC, WSi$_2$, WsSi$_3$, and WC were identified as constituent phases. The sintered body had an SiC content having a value in a range of 14.4 wt % or more and 48.6 wt % or less in each of these experimental examples.

Furthermore, in each of Example 15, Example 17 to Example 19, and Example 21, the sintered body had an open porosity of 0.1% or less. That is to say, an extremely dense composite material sintered body was obtained.

In addition, the sintered body had a coefficient of thermal expansion having a value of 4.8 ppm/K to 4.9 ppm/K, which satisfied a range of 4.6 ppm/K to 5.6 ppm/K. That is to say, a value that is slightly smaller than coefficient of thermal expansion of aluminum nitride was obtained.

In each of Example 15, Example 17 to Example 19, and Example 21 in which the dense composite material sintered body was obtained, a tungsten silicide (WSi$_2$ and W$_5$Si$_3$) content was greater than a silicon carbide (SiC) content.

In addition, the composite material sintered body in each of Example 15, Example 17 to Example 19, and Example 21 that was determined to have an extremely high density had a bend strength of more than 350 MPa. Furthermore, the composite material sintered body had a fracture toughness value (K1c) of 7.5 MPa·m$^{1/2}$ to 8.5 MPa·m$^{1/2}$ and a Young's modulus of 523 GPa to 561 GPa. They are values generally higher than those in Example 6 to Example 14. The thermal conductivity was 134 W/m·K or more and had a value higher than values in Example 6 to Example 14.

Example 22 to Example 23

In each of Example 22 to Example 23, the composite material sintered body was manufactured using SiC powder, WSi$_2$ powder, and WC powder as raw materials. Only the product #1000 was used as the SiC powder.

As shown in Table 1, the raw material composition in Example 22 was as follows:

SiC (product #1000): 12.8 wt %;
WSi$_2$: 13.5 wt %; and
WC: 73.7 wt %.

The raw material composition in Example 23 was as follows:

SiC (product #1000): 5.7 wt %;
WSi$_2$: 26.7 wt %; and
WC: 67.6 wt %.

On the other hand, as the hot press condition, a common maximum temperature of 1800° C. and a common press pressure of 250 kgf/cm$^2$ were used.

That is to say, Example 22 and Example 23 differ from Example 6, Example 10, Example 11, Example 12, Example 14, and Example 18, which have the same hot press condition as Example 22 and Example 23, in weight percentages of the SiC powder (product #1000), the WSi$_2$ powder, and the WC powder as raw materials.

In each of the experimental examples, the sintered body was obtained, and only SiC, WSi$_2$, WsSi$_3$, and WC were identified as constituent phases. The sintered body had an SiC content having a value in a range of 14.4 wt % or more and 48.6 wt % or less in each of these experimental examples.

However, a tungsten silicide (WSi$_2$ and WsSi$_3$) content was greater than a silicon carbide (SiC) content in Example 23, whereas the tungsten silicide content was smaller than the silicon carbide content in Example 22.

The sintered body had an open porosity of 0.1% or less in each of Example 22 and Example 23. That is to say, an extremely dense composite material sintered body was obtained in each of the experimental examples.

On the other hand, the sintered body had a coefficient of thermal expansion satisfying a range of 4.6 ppm/K to 5.6 ppm/K in each of the experimental examples but had a coefficient of thermal expansion of 4.6 ppm/K as a lower limit of the range in Example 22. The sintered body had a coefficient of thermal expansion of 5.6 ppm/K as an upper limit of the range in Example 23.

The bend strength was 423 MPa in Example 22 and was 424 MPa in Example 23. That is to say, the bend strength exceeded 350 MPa in each of the experimental examples but did not substantially differ therebetween.

On the other hand, the fracture toughness value (K1c), the Young's modulus, and the thermal conductivity respectively had high values of 8.2 MPa·m$^{1/2}$, 548 GPa, and 134 W/m·K in Example 23 but respectively remained at values of 6.0 MPa·m$^{1/2}$, 332 GPa, and 104 W/m·K in Example 22.

It is believed, from comparison with the other experimental examples, that a tungsten silicide (WSi$_2$ and WsSi$_3$) content of 12.7 wt % smaller than a silicon carbide (SiC) content of 28.1 wt % might affect characteristics of the sintered body in Example 22. It is also believed that a small weight percentage of SiC in the raw material powder of 5.7 wt % might affect characteristics of the sintered body in Example 23.

Example 24 to Example 26

In each of Example 24 to Example 26, the composite material sintered body was manufactured using SiC powder, WSi$_2$ powder, and W powder as raw materials. The product #500 and the product #6000 were used as the SiC powder.

As shown in Table 1, the raw material composition was the same as that in each of Example 1 and Example 2 as follows:

SiC (product #500): 18.0 wt %;
SiC (product #6000): 9.7 wt %;
WSi$_2$: 55.3 wt %; and
W: 17.0 wt %.

As the hot press condition, Examples 24 to Example 26 differ from Example 1 to Example 5 in combination of the maximum temperature and the press pressure. In Example 24, the maximum temperature was 1850° C., and the press pressure was 225 kgf/cm$^2$. In Example 25, the maximum temperature was 1700° C., and the press pressure was 300 kgf/cm$^2$. In Example 26, the maximum temperature was 1650° C., and the press pressure was 300 kgf/cm$^2$.

That is to say, the maximum temperature is higher but the press pressure is lower in Example 24 than in Example 1. The press pressure is higher in Example 25 than in Example 2 as a comparative example. Furthermore, the maximum temperature is lower but the press pressure is higher in Example 26 than in Example 2 as the comparative example.

In each of Example 24 to Example 26, the sintered body was obtained, and only SiC, WSi$_2$, WsSi$_3$, and WC were identified as constituent phases. The sintered body had an SiC content of 48.6 wt % or less in each of Example 24 and Example 25 but had an SiC content of 50.1 wt %, which exceeded 48.6 wt %, in Example 26.

The sintered body had an open porosity of less than 1% in each of Example 24 and Example 25 but had an open porosity of more than 1% in Example 26.

The coefficient of thermal expansion was 5.4 ppm/K, which satisfied a range of 4.6 ppm/K to 5.6 ppm/K, in each of Example 24 to Example 26. On the other hand, the bend strength was 252 MPa, which was similar to that in each of Example 1 and Example 2, in each of Example 24 and Example 25 but remained at 116 MPa in Example 26. In each of Example 24 and Example 25, the fracture toughness value (K1c) and the Young's modulus were similar to those in Example 1, but the thermal conductivity slightly exceeded the thermal conductivity in Example 1.

Summary of Example 1 to Example 26

Results in Example 1 to Example 26 indicate that, in a case where the weight percentage of SiC has a value in a range of 5.7 wt % to 27.7 wt %, the weight percentage of WSi$_2$ has a value in a range of 12.5 wt % to 55.3 wt %, and the weight percentage of WC has a value in a range of 49.5 wt % to 81.3 wt % or the weight percentage of W has a value in a range of 17.0 wt % to 55.7 wt % in the raw material powder, a composite material sintered body that contains 14.4 wt % or more and 48.6 wt % or less of silicon carbide, is dense to have an open porosity of 1% or less, and has a coefficient of thermal expansion close to the coefficient of thermal expansion of aluminum nitride can be obtained by appropriately setting the hot press condition.

The results also indicate that the dense composite material sintered body fulfills a four-point bend strength of 200 MPa or more, a fracture toughness value in a range of 6.0 MPa·m$^{1/2}$ to 8.8 MPa·m$^{1/2}$, a Young's modulus in a range of 273 GPa to 594 GPa, and a thermal conductivity of 90 W/m·K or more.

In particular, results in Example 6 to Example 23 indicate that, in a case where the weight percentage of SiC has a value in a range of 5.7 wt % to 13.1 wt %, the weight percentage of WSi$_2$ has a value in a range of 12.5 wt % to 39.1 wt %, and the weight percentage of WC has a value in a range of 49.5 wt % to 81.3 wt % in the raw material powder, an extremely dense composite material sintered body having an open porosity of 0.1% or less can be obtained, and, further, the composite material sintered body has a high four-point bend strength of 350 MPa or more.

While the invention has been shown and described in detail, the foregoing description is in all aspects illustrative and not restrictive. It is therefore understood that numerous modifications and variations can be devised without departing from the scope of the invention.

What is claimed is:

1. A composite material sintered body
comprising silicon carbide, tungsten silicide, and tungsten carbide,
containing 14.4 wt % or more and 48.6 wt % or less of silicon carbide, and
having an open porosity of 1% or less.

2. The composite material sintered body according to claim 1,
having a difference in coefficient of thermal expansion at 40° C. to 550° C. from aluminum nitride of 0.5 ppm/K or less.

3. The composite material sintered body according to claim 2,
having an open porosity of 0.1% or less.

4. The composite material sintered body according to claim 1, wherein
surfaces of individual crystal particles of silicon carbide are covered with at least one of tungsten silicide and tungsten carbide so that crystal particles of at least one of tungsten silicide and tungsten carbide are present in a gap between crystal particles of silicon carbide.

5. The composite material sintered body according to claim 1,
having a tungsten silicide content greater than a silicon carbide content.

6. The composite material sintered body according to claim 1,
having a four-point bend strength of 200 MPa or more.

7. The composite material sintered body according to claim 6,
having a four-point bend strength of 350 MPa or more.

8. The composite material sintered body according to claim 1,
having a thermal conductivity of 90 W/m·K or more.

9. The composite material sintered body according to claim 1,
having a fracture toughness value of 6.0 MPa·m$^{1/2}$ to 8.8 MPa·m$^{1/2}$.

10. The composite material sintered body according to claim 1,
having a Young's modulus of 273 GPa to 594 GPa.

11. The composite material sintered body according to claim 10,
having a Young's modulus of 460 GPa to 594 GPa.

12. A joined assembly of a first member and a second member,
the first member composed of a composite material sintered body,
the second member composed of aluminum nitride, and
the composite material sintered body
comprising silicon carbide, tungsten silicide, and tungsten carbide,
containing 14.4 wt % or more and 48.6 wt % or less of silicon carbide, and
having an open porosity of 1% or less.

13. The joined assembly according to claim 12, wherein a difference in coefficient of thermal expansion at 40° C. to 550° C. between the first member and the second member is 0.5 ppm/K or less.

14. The joined assembly according to claim 13, wherein the first member has an open porosity of 0.1% or less.

15. The joined assembly according to claim 12, wherein the first member and the second member are metallurgically joined.

16. A semiconductor manufacturing apparatus member comprising
a joined assembly of a first member and a second member, wherein
the first member is a cooling member to cool the second member and comprises a composite material sintered body,
the second member comprises aluminum nitride, and
the composite material sintered body
comprises silicon carbide, tungsten silicide, and tungsten carbide,
contains 14.4 wt % or more and 48.6 wt % or less of silicon carbide, and
has an open porosity of 1% or less.

17. The semiconductor manufacturing apparatus member according to claim 16, wherein
a difference in coefficient of thermal expansion at 40° C. to 550° C. between the first member and the second member is 0.5 ppm/K or less.

18. The semiconductor manufacturing apparatus member according to claim 17, wherein
the first member has an open porosity of 0.1% or less.

19. The semiconductor manufacturing apparatus member according to claim 16, wherein
the first member and the second member are metallurgically joined.

20. A composite material sintered body manufacturing method comprising:
a) mixing SiC powder, WSi$_2$ powder, and WC powder or W powder to obtain a powder mixture;
b) forming the powder mixture into a predetermined shape to obtain a formed body; and
c) subjecting the formed body to hot press firing under an inert atmosphere, wherein
in the step a), 5.7 wt % to 27.7 wt % of SiC powder, 12.5 wt % to 55.3 wt % of WSi$_2$ powder, and 49.5 wt % to 81.3 wt % of WC powder or 17.0 wt % to 55.7 wt % of W powder are mixed so that a total weight percentage is 100 wt %, and
in the step c), a maximum temperature is 1700° C. to 1850° C., and a press pressure is 225 kgf/cm$^2$ to 300 kgf/cm$^2$.

21. The composite material sintered body manufacturing method according to claim 20, wherein
in the step a), 5.7 wt % to 13.1 wt % of SiC powder, 12.5 wt % to 39.1 wt % of WSi$_2$ powder, and 49.5 wt % to 81.3 wt % of WC powder are mixed so that a total weight percentage is 100 wt %.

\* \* \* \* \*